(12) United States Patent
Navid et al.

(10) Patent No.: US 8,212,416 B2
(45) Date of Patent: Jul. 3, 2012

(54) DEVICE FOR FILTERING HARMONICS

(75) Inventors: Hamid Navid, Richmond Hill (CA); Mokhtar Kamli, Mississauga (CA)

(73) Assignee: Synergy Energy Inc., Mississauga (CA)

( * ) Notice: Subject to any disclaimer, the term of this patent is extended or adjusted under 35 U.S.C. 154(b) by 299 days.

(21) Appl. No.: 12/646,821

(22) Filed: Dec. 23, 2009

(65) Prior Publication Data

US 2010/0156194 A1   Jun. 24, 2010

Related U.S. Application Data

(60) Provisional application No. 61/140,798, filed on Dec. 24, 2008.

(51) Int. Cl.
*H02J 3/01* (2006.01)
(52) U.S. Cl. ........................................ 307/105
(58) Field of Classification Search .................. 307/105
See application file for complete search history.

(56) References Cited

U.S. PATENT DOCUMENTS

| | | | |
|---|---|---|---|
| 3,435,374 A | 3/1969 | Whitten | |
| 4,812,669 A | 3/1989 | Takeda et al. | |
| 5,341,281 A * | 8/1994 | Skibinski | 363/39 |
| 5,387,821 A | 2/1995 | Steciuk et al. | |
| 6,127,743 A | 10/2000 | Levin et al. | |
| 6,339,265 B1 * | 1/2002 | Levin et al. | 307/407 |
| 6,577,199 B2 * | 6/2003 | Dent | 330/302 |
| 6,844,794 B2 | 1/2005 | Lauri | |
| 7,199,692 B2 * | 4/2007 | Suzuki et al. | 336/170 |
| 7,403,403 B2 * | 7/2008 | Saitoh | 363/34 |
| 7,459,995 B2 * | 12/2008 | Suzuki | 333/172 |
| 2006/0220972 A1 * | 10/2006 | Saitoh | 343/722 |
| 2007/0241838 A1 * | 10/2007 | Suzuki | 333/181 |
| 2007/0252664 A1 * | 11/2007 | Saitoh et al. | 333/175 |

FOREIGN PATENT DOCUMENTS

| | | | |
|---|---|---|---|
| EP | 472151 A1 * | 2/1992 | |
| JP | 2006203862 A * | 8/2006 | |
| JP | 2007067941 A * | 3/2007 | |

* cited by examiner

*Primary Examiner* — Adi Amrany
(74) *Attorney, Agent, or Firm* — Blake, Cassels & Graydon LLP; Wilfred P. So; Santosh K. Chari

(57) ABSTRACT

A power device is provided for filtering or dampening harmonics and optimizing the power factor in power distributions systems. A device for a 3-phase power system comprises series inductors able to communicate between an AC power source and a non-linear load. Connected in parallel to the series inductors, at the junction with the non-linear load, are shunt inductors used to trap harmonic currents. Power factor correction capacitors are connected to the ends of the shunt inductors. The series inductor and shunt inductor are used to form a coaxial reactor assembly, which further comprises a reactor core. The coaxial reactor assembly is formed by winding a first inductor around the core and then winding a separate second inductor around the perimeter of the first inductor. In another embodiment, the device includes a third inductor to achieve better dampening and power factor performance.

24 Claims, 9 Drawing Sheets

DEVICE FOR FILTERING HARMONICS

This application claims priority from U.S. provisional application No. 61/140,798 filed on Dec. 24, 2008, the contents of which are incorporated herein by reference.

FIELD OF THE INVENTION

The present invention relates generally to devices for dampening harmonics.

BACKGROUND OF THE INVENTION

Electric power is often provided in the form of alternating currents and voltages. In North America, for example, the electric power may typically be provided at a frequency of 60 Hz. When the electric power interacts with various electronic devices, current and voltage distortions may occur. The distorted power may affect the operation of many electronic devices. In one example, a building's power distribution system may be connected to various electronic devices comprising, for example, computers, electronic ballasts, printers, fax machines, HVAC equipment, and uninterrupted power supplies. These devices, or non-linear loads, may cause the quality of the building's power supply to degrade.

Harmonics cause distortion in sinusoidal power waveforms. These distortions are referred to as "harmonic distortion" and are caused by various factors. By way of background, a harmonic of a wave, in this case a power signal, is an integer multiple of the fundamental frequency. As mentioned above, the fundamental frequency, or frequency at which electric power is generated, in North America is 60 Hz. In European countries, the fundamental frequency may be 50 Hz, while an aircraft system may generate power at a fundamental frequency of 400 Hz. It is appreciated that the fundamental frequency in a power system may vary. The superposition of a harmonic current and a current operating at the fundamental frequency may generate a distorted current and/or voltage signal, also referred to as harmonic distortion.

Typically, harmonic distortion provides undesirable voltage and current waveforms to electronic devices. It is appreciated that many electronic devices are designed for power input in the form of an undistorted sine wave. Therefore, a distorted power input may cause a variety of problems for electronic devices, including overheating, increased power consumption, reduced power factor, malfunction or failure, erratic operation of breakers and relays, and pronounced magnetic fields near transformers and switch gears. As described herein, filtering or dampening the harmonics refers to the reduction of harmonic distortion.

It has been shown that harmonics may be dampened by using various approaches, including without limitation, active and passive filters. Active filters may use additional energy to dampen the harmonics, and in some cases may rely on the principle of wave cancellation. Active filters generally require costly electronic components, which may have relatively short life expectancies. Furthermore, due to limited capability of electronic components, active filters are typically not suitable for larger current loads.

Passive harmonic mitigation generally utilizes the flow of current to trap or pull the harmonics within a device, thereby preventing the propagation of the harmonics throughout the system. By way of background, passive harmonic filters for dampening or filtering harmonics generally comprise reactors and capacitors. A reactor may comprise at least one inductor and may be used to absorb sudden changes in current. Advantages of passive systems over active ones include lower costs, simplified structure, utility across larger current and voltage ranges, and increased robustness.

In addition to the above considerations, power factor is also of interest in the field of harmonic filtration or mitigation devices. It is appreciated that the power factor is the ratio between the power used (i.e. Active or Real power) and power supplied (i.e. Apparent power) to a device. In ideal circumstances, the power factor would be 1.

An example of a passive filter is provided to U.S. Pat. No. 6,127,743 (the '743 patent) which discloses a harmonic mitigation device comprising two oppositely wound inductors arranged in series. These oppositely wound inductors are further electrically connected in series between an AC source and non-linear load. A third inductor is connected in parallel between the junction of the two series inductors. A capacitor is connected in series to the third inductor. The '743 patent teaches that the inductors are stacked vertically along the length of a common reactor core.

In U.S. Pat. No. 6,844,794 (the '794 patent), a harmonic filter is described using two inductors. The '794 patent shows that one of the inductors that is electrically connected in series to the non-linear load may be removed, while mitigating the effects of the harmonics. In the '794 patent, an embodiment is described with two separate reactors.

There exists a need for a device for dampening harmonics that overcomes at least one of the drawbacks associated with the prior devices.

SUMMARY OF THE INVENTION

In one aspect, the invention provides a harmonic filter device for a single-phase power system comprising at least one series inductor, which, when in use, is electrically connected between an AC power source and a non-linear load. Connected in parallel to the series inductor, at the junction with the non-linear load, is a shunt inductor that is used to trap harmonic currents. A power factor correction capacitor is connected to the end of the shunt inductor. The series and shunt inductors are used to form a coaxial reactor assembly, which further comprises a reactor core. The coaxial reactor assembly is formed by winding a first inductor around the reactor core and then winding a separate second inductor around the perimeter of the first inductor. In an embodiment, the ampacity of the wire used to form the shunt inductor may be different from the ampacity of the series inductor wire. Ampacity is defined herein as the capacity to carry current.

In another aspect of the invention, three coaxial reactor assemblies may be used to form a harmonics filter for three-phase power systems.

In another aspect of the invention, a device for dampening harmonics is provided. The device is electrically connectable to at least one power source and at least one non-linear load. The device comprises a first inductor comprising a first end being connectable to the at least one power source and a second end being electrically connectable to the at least one non-linear load. There is also a second inductor comprising a first end electrically connected to the first or the second end of the first inductor and a second end electrically connected to at least one capacitor. The first and second inductors are in a coaxial arrangement comprising two layers wound around a core. The layers comprise an inner layer adjacent to the core, the inner layer comprising one of the inductors. The layers also comprise an outer layer provided over the inner layer, the outer layer comprising the other of the inductors.

In another aspect of the invention, the first end of the first inductor is a start of winding and the second end of the second inductor is another start of winding.

In another aspect of the invention, the first end of the first inductor is a start of winding and the first end of the second inductor is another start of winding.

In another aspect of the invention, the inner layer comprises the first inductor and the outer layer comprises the second inductor.

In another aspect of the invention, the inner layer comprises the second inductor and the outer layer comprises the first inductor.

In another aspect of the invention, the second inductor comprises a wire with a smaller cross-sectional area than the first inductor.

In another aspect of the invention, the first end of the second inductor is connected to the second end of the first inductor.

In another aspect of the invention, a three-phase power distribution system is provided comprising three phase assemblies, wherein each phase assembly comprises the device for dampening harmonic distortions.

In another aspect of the invention, a device for dampening harmonics is provided. The device is electrically connectable to at least one power source and at least one non-linear load. The device comprises a first inductor and a second inductor, each comprising a first end and a second end. The first end of the first inductor is electrically connectable to the at least one power source. The second end of the first inductor is electrically connected to the first end of the second inductor. The second end of the second inductor is electrically connectable to the at least one non-linear load. The second end of the first inductor and the first end of said second inductor are both electrically connected to at least one capacitor. The first and second inductors are in a coaxial arrangement comprising two layers wound around a core. The layers comprise an inner layer adjacent to the core, the inner layer comprising one of the inductors. The layers also comprise an outer layer provided over the inner layer, whereby the outer layer comprises the other of the inductors.

In another aspect of the invention, a device is provided for dampening harmonics. The device is electrically connectable to at least one power source and at least one non-linear load. The device comprises a first inductor, a second inductor and a third inductor, each comprising a first end and a second end. The first end of the first inductor is electrically connectable to the at least one power source and the second end of the first inductor is electrically connected to the first end of the third inductor. The second end of the third inductor is electrically connectable to the at least one non-linear load. The first end of the second inductor is electrically connected to the first or the second end of the first inductor. The second end of the second inductor is electrically connected to at least one capacitor. Two of said inductors are in a coaxial arrangement comprising two layers wound around a first core. The layers comprise an inner layer adjacent to the first core, the inner layer comprising one of the inductors. An outer layer is provided over the inner layer, the outer layer comprising the other of the inductors.

In another aspect of the invention, the remaining one of the three inductors is coaxially provided as a third layer over the outer layer.

In another aspect of the invention, the inner and outer layers cover a first section of the first core and wherein the remaining one of the three inductors is wound over a second section of the first core and separated from the inner and outer layers.

In another aspect of the invention, the remaining one of the three inductors is wound around a second core.

BRIEF DESCRIPTION OF THE DRAWINGS

Embodiments of the invention will now be described with reference to the appended drawings wherein:

FIG. 2b is a top view of the coaxial reactor assembly as shown in FIG. 2a.

FIG. 15b is a top view of the coaxial reactor assembly as shown in FIG. 15a.

DETAILED DESCRIPTION OF THE INVENTION

Figure 1:
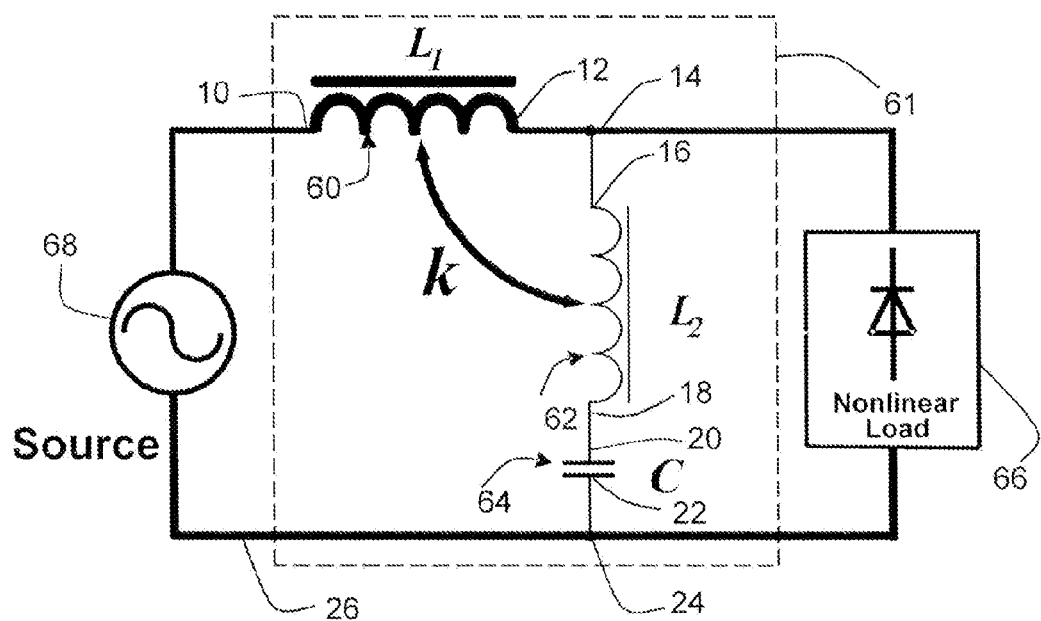
FIG. 1 is an electrical schematic of a harmonic filter device for only one phase according to one aspect of the invention.

It will be appreciated that for simplicity and clarity of illustration, the figures contained herein will include reference numerals that may be repeated to indicate corresponding or analogous elements. The present description is intended to be directed to a person skilled in the art of harmonic filters. The description is not to be considered as limiting the scope of the invention described herein.

The present invention provides, in one aspect, a passive filter device for filtering or dampening harmonics, thereby reducing the total harmonic distortion. Filtering is known in the art to mean dampening or reducing harmonics. As used herein, the terms filtering, dampening or reducing harmonics may be used interchangeably. In another aspect, the device of the invention further provides an ameliorated power factor. In yet another aspect, the device may be used to limit a current's rate of rise when a power system or electronic device is powered on. It is appreciated that the device of the present invention may alternatively be referred to as a harmonic mitigation device or a harmonics filter device.

The device for dampening or filtering harmonics may be applied to non-linear loads. It is appreciated that non-linear loads refer to devices that operate using voltage and current, wherein the voltage and current have a non-linear relationship. In one example, the harmonic filter may be used in high power applications including, for example, power distribution systems of office buildings or factories. It is appreciated that the harmonic filter's components may be sized to be suitable for various applications.

FIG. 1 shows an embodiment of one phase 61 of a three-phase harmonic filter in isolation from the other two phases. The one phase 61 comprises at least two inductors, namely a "series" inductor 60 and a "shunt" inductor 62, and at least one capacitor 64. The terms "series" and "shunt" will be discussed below. For the purposes of this description, reference will be made to one series inductor, one shunt inductor and one capacitor. However, it will be understood that more than one of each component may be used in the invention in accordance with the description provided herein. In this embodiment, a power source 68, the series inductor 60, and a non-linear load 66 are arranged in series to allow the current from the power source 68 to flow to the non-linear load 66. Specifically, a first end 10 of the series inductor 60 is electrically connected to the power source 68 and a second end 12 of the series inductor 60 is electrically connected to the non-linear load 66. In effect, the series inductor 60 is arranged in series between the power source 68 and non-linear load 66.

Continuing with FIG. 1, the shunt inductor 62 is electrically connected in parallel with the series inductor 60 to direct harmonic currents towards itself and the capacitor 64. The shunt inductor 62 comprises a first end 16 and a second end 18. The first end 16 of the shunt inductor 62 is electrically connected at a first electrical junction 14 located between the series inductor 60 and the non-linear load 66.

A first end 20 of the capacitor 64 is electrically connected to the second end 18 of the shunt inductor 62. The capacitor's 64 opposite second end 22 is electrically connected at a second electrical junction 24, which is located on an electrical connection 26 extending directly between the non-linear load 66 and the power source 68.

The capacitor 64 may comprise a single capacitor component or a number of capacitors arranged to form a capacitor bank. It will be understood that the purpose of the capacitor is (i) to create, together with the shunt inductor, a low impedance path in order to trap the harmonics and (ii) to improve the system power factor, and any capacitance means to that end are encompassed by the scope of this invention.

It is appreciated that, in general, an inductor's first end may be a start of the winding and the second end may be a finish of the winding. Conversely, an inductor's first end may be a finish of the winding and the second end may be a start of the winding. By way of background, according to the dot convention as known to those skilled in the art of inductors, the start of a winding, hereon referred to as a start point, is indicated by a dot. The opposite end, or finish, of the winding is hereon referred to as a finish point. The polarity of an inductor is indicated by the positioning the start point on either one of the inductor's two ends.

In one aspect of the invention, the series inductor 60 and shunt inductor 62 are generally cylindrical and are arranged in a coaxial configuration to increase the mutual coupling therebetween. Such coupling may be represented by a coupling factor k.

In one embodiment, the mutual coupling is generated by placing the inductors 60, 62 around a shared reactor core. By way of background, an inductor may comprise a copper wire that is wound in a helical configuration. In some cases, the inductor may be wound around a metal core.

Figure 2A:
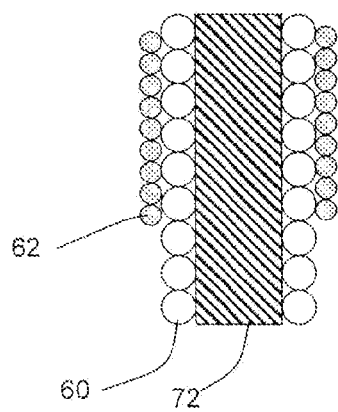
FIG. 2a is a cross-sectional view of a coaxial reactor assembly according to one aspect of the invention.
Figure 2B:
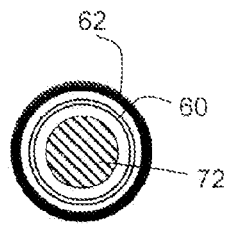

FIGS. 2a and 2b show a reactor assembly comprising a single reactor core 72 and two wound inductors 60, 62. More generally, in one aspect of the invention, a core 72 and at least two inductors are provided in a layered coaxial arrangement around the core 72. In one embodiment, the series inductor 60 is wound around the reactor core 72 first, thereby forming an inner layer that is coaxially arranged around the core 72. The shunt inductor 62 is then wound around the outer perimeter of the series inductor 60, such that the series inductor 60 and the shunt inductor 62 are coaxial with one another. The shunt inductor 62 forms an outer layer that is coaxially arranged around the core 72. In another embodiment, the shunt inductor 62 may be wound first around the core 72, followed by the series inductor 64 around the outer perimeter of the shunt inductor 62. It is appreciated that having layered inductors or coaxial inductors along the length of the reactor core 72, may be also referred to as a coaxial reactor assembly. It is also appreciated that the layered coaxial arrangement comprises at least two layers, for example, an inner layer and an outer layer. Although not shown, the inductors 60, 62 are coated with an insulation to electrically insulate the inductors 60, 62 from one another and to electrically insulate the wires within each inductor 60, 62. It is further appreciated that the close proximity and increased adjacent surface area between the series 60 and shunt 62 inductor in a coaxial configuration increases the coupling factor k.

The coaxial reactor assembly may include further variations, such as the direction in which the wires are wound (i.e. clockwise or counter clockwise) and the position of the start point. As will be understood by a person skilled in the art, different winding configurations may affect the mutual or electromagnetic coupling between the inductors. In a preferred embodiment of the coaxial reactor assembly, the inductors 60, 62 may be wound starting from different ends of the reactor core 72. Specifically, one inductor may be wound around a core 72 from the bottom-up, while the other inductor may be wound from the top-down. This configuration allows for a positive mutual inductance between the two inductors 60, 62. In another embodiment, both inductors 60, 62 may be wound around the core 72 starting from the same end. This configuration establishes a negative mutual inductance between the two inductors 60, 62. It is appreciated that the start points may be placed in various configurations to achieve different polarities and coupling effects. It will also be understood that various configurations that allow for two separate inductors to be wound in a coaxial arrangement are encompassed within the scope of the invention.

Figures 3A, 3B:
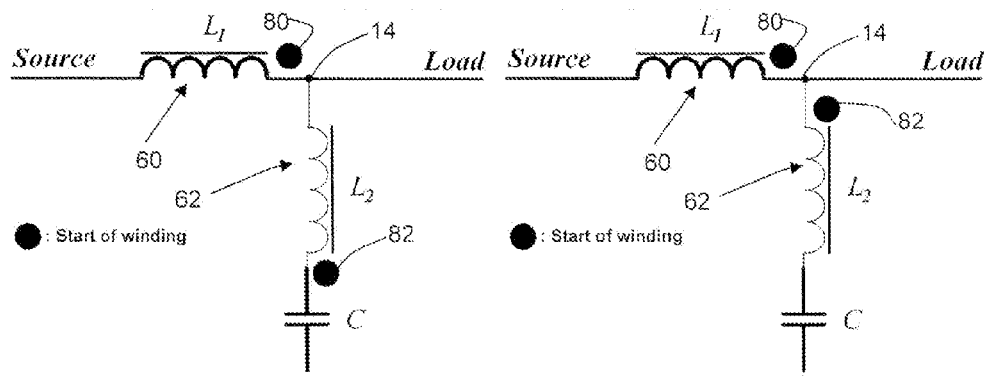
FIG. 3a is an electrical schematic of an embodiment of a harmonic filter device showing only one phase.
FIG. 3b is an electrical schematic of another embodiment similar to FIG. 3a showing only one phase.
Figures 4A, 4B:
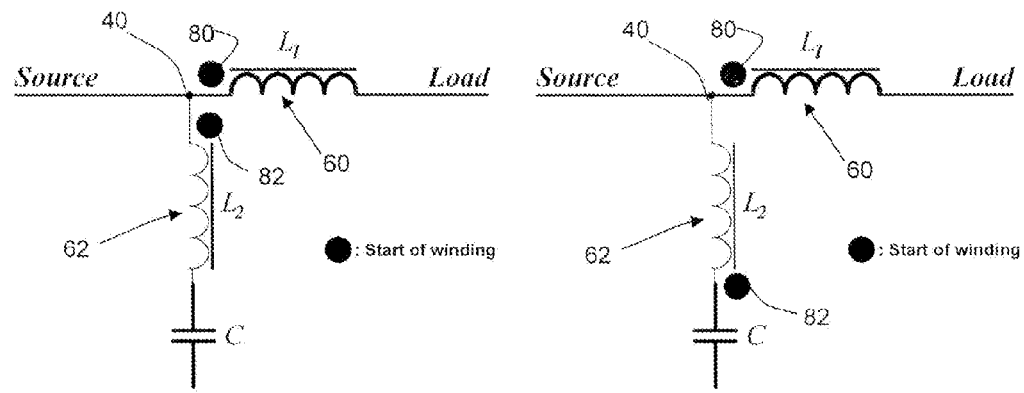
FIG. 4a is an electrical schematic of an embodiment of a harmonic filter device showing only one phase.
FIG. 4b is an electrical schematic of another embodiment similar to FIG. 4a showing only one phase.
Figure 5:
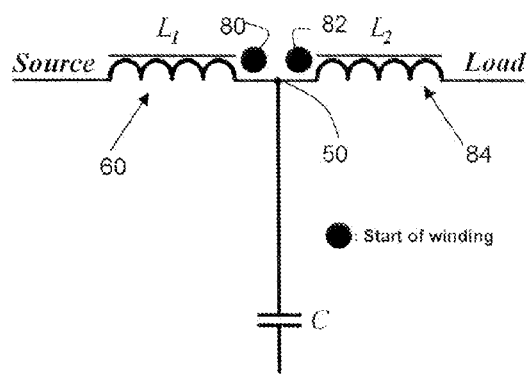
FIG. 5 is an electrical schematic of another embodiment of a harmonic filter device showing only one phase.

FIGS. 3 through 5 represent various topologies for only one phase, for example, of a three-phase or single-phase harmonic filter. FIGS. 3a and 3b show a similar topology to that of FIG. 1. More particularly, in FIG. 3a, the start point 80 on the series inductor 60 is electrically connected to the finish point of the shunt inductor 62 at a junction 14, whereby the junction 14 is also electrically connected to the load. The finish point of the series inductor 60 is electrically connected to the source. The start point 82 of the shunt inductor 62 is electrically connected to a capacitor. In another embodiment shown in FIG. 3b, the start point 80 of the series inductor 60 is electrically connected at the junction 14 to the start point 82 of the shunt inductor 62. Other configurations for the start and finish points on the inductors are encompassed within the scope of this invention.

FIGS. 4a and 4b show a different topology wherein the shunt inductor 62 is connected at a junction 40 in electrical connection with the source and the series inductor 60. In one particular embodiment shown in FIG. 4a, the start point 80 of the series inductor 60 is electrically connected at junction 40, which is also in electrical connection with the source and the start point 82 of the shunt inductor 62. The finish point of the series inductor 60 is electrically connected to the load, and the finish point of the shunt inductor 62 is electrically connected to a capacitor. By contrast, in FIG. 4b, the start point 80 of the series inductor 60 is electrically connected to the source and junction 40, whereby the finish point of the shunt inductor 62 is also electrically connected to the junction 40. Further, the start point 82 of the shunt inductor 62 is electrically connected to a capacitor. Other configurations for the start and finish points on the inductors are encompassed within the scope of this invention.

FIG. 5 shows another embodiment wherein a first inductor 60 and a second inductor 84 are both in series between the source and the load. Specifically, the first inductor 60 is electrically connected in series to the source; the second inductor 84 is electrically connected in series to the first inductor 60; and the load is electrically connected in series to the second inductor 84. An electrical junction 50 is positioned between the two inductors 60, 84, to which a capacitor is connected in parallel. In the embodiment according to FIG. 5, the start points 80, 82 of each inductor 60, 64 are electrically connected to one another. Other configurations for the start and finish points on the inductors are encompassed within the scope of this invention.

It is appreciated that various topologies for the two inductors are encompassed by the scope of this invention and may be applied to three-phase power systems. It is further appreciated that all of the above inductor pairs, whether in series or parallel to one another, are used to form a coaxial reactor assembly. For example, inductors 60 and 84 in FIG. 5 are both wound coaxially around a common reactor core.

Various types of core configurations may also apply to the coaxial reactor assembly. The core 72 may be formed of iron, silicon steel, and/or ferrite material. In a preferred embodiment, the core 72 is comprised of grain oriented electromagnetic steel. The core 72 may also comprise various geometrical configurations including for example, a bobbin and a toroid. The core 72 may further comprise several smaller cores. The purpose of the reactor core is to (i) fix the inductance values of the series (60) and shunt (62) inductors and (ii) increase their mutual coupling, and any means to that end are encompassed by the scope of this invention.

It is appreciated that two separate inductors 60, 62 arranged coaxially provide several advantages. It is recognized that the coaxial configuration increases the mutual coupling between the two inductors 60, 62, which may be used advantageously to increase power efficiency in the harmonic filter as discussed in further detail below. Furthermore, the two separate windings 60, 62 allows for each inductor to have a different cross-sectional area to accommodate for the different current loads, thereby increasing the harmonics filtering performance.

Additional advantages include reduced space requirements of the harmonic device, wherein the coaxial reactor assembly requires a single reactor core, as opposed to two cores, to interact with two separate inductors. Space requirements are further reduced since the coaxial arrangement, or layering of the inductors around a single core, facilitates the use of a reactor core having a shorter length. It is appreciated that the use of a single reactor core having a shorter length also reduces the amount of core material and thereby, the associated costs.

The following is an explanation of how various aspects of the aforementioned device operates and is not intended to limit the scope of the invention.

As will be known to those skilled in the art, the reactance of the shunt inductor 62 may be equated to that of the capacitor 64. From this equality, it is understood that the capacitance C of the capacitor 64 is inversely related to the inductance and mutual inductance of the shunt inductor 62. In effect, the capacitance C is inversely related to the coupling factor k, whereby the coupling factor k is used to determine the mutual inductance. In one example where the relative position of the winding starts allow for an inverse relationship, such as in FIG. 3a, a larger coupling factor k may result in a lower capacitance value C. For clarity, a capacitor with a smaller capacitance may be herein referred to as a smaller capacitor.

It is therefore recognized that the coaxial inductor arrangement provides a larger coupling factor k and therefore reduces the capacitance requirement in the circuit of the invention. As a result, a smaller capacitor 64 may be used to achieve a desired power factor and harmonic dampening performance. The coupling factor k may be increased by the close proximity in the coaxial reactor assembly. This configuration, shown in FIG. 3a for example, allows for the coupling factor k to achieve values above 0.95. For tight coupling, the coupling factor k may reach 0.99.

Several advantages are realized by allowing the use of a smaller capacitor. Typically, more electric charge accumulates in a large capacitor and therefore, may incur larger energy loss, for example in the form of heat. By contrast, a lower amount of electric charge accumulates in a smaller capacitor and thereby, provides the advantage of decreasing energy loss. As a result, the coaxial reactor assembly facilitates the use of a smaller capacitor in the harmonics filter device of the invention to achieve the desired harmonic and power reductions in high-power applications, while advantageously increasing energy efficiency.

Another advantage of a smaller capacitor is the decreased cost of the component, thereby reducing the cost to manufacture the harmonics filter device 61. Moreover, capacitors having lower capacitance values are generally smaller in size. It is recognized that a smaller capacitor 64 achieved in the invention reduces the size of the harmonics filter device 61 and thus, facilitates installation of the device 61 in environments with constrained space.

Yet another advantage of a smaller capacitor is the reduced risk of injury to a person, such as a technician, servicing a harmonics filter device 61. The harmonics filter device 61 significantly reduces the capacitor size and, therefore, the amount of stored electric charge. A lower stored charge reduces the risk of inadvertently electrocuting a technician.

In addition to increasing the coupling factor, the coaxial reactor assembly of the invention increases the power factor and power efficiency of the harmonic filter device 61. Generally, the shunt inductor 62 acts as a harmonic current trap and directs harmonic current towards the capacitor 64. The harmonic current passing through the shunt inductor 62 is generally lower than the main power current being transmitted between the power source 68 and the load 66. Therefore, the ampacity of the shunt inductor is different from the ampacity of the series inductor. Various characteristics of the shunt inductor 62, such as the resistance of the inductor's wire, are preferably selected to allow for harmonic currents to be trapped, while reducing the amount of source or fundamental current from also becoming trapped by the shunt inductor 62. It is understood that the trapping of source current by the shunt inductor 62 may lead to a decrease in the power output to the load 66.

Separate inductors, namely the wires used to form the series inductor 60 and shunt inductor 62, are preferably made of different cross-sectional area windings suited for the currents passing through them. Specifically, the shunt inductor 62 may comprise a wire with a smaller cross-sectional area than the series inductor 60. The embodiment of the coaxial reactor assembly shown in FIG. 2a illustrates the shunt inductor 62 having a smaller cross-sectional area than the series inductor 60. This accommodates for the smaller harmonic current flowing through the shunt inductor 62, while advantageously increasing the power factor and power efficiency of the harmonic filter device 61.

It is recognized that additional characteristics of an inductor wire may affect the flow of current, including without limitation the conductive material and the number of strands in the wire. In a preferred embodiment, the purpose of the shunt inductor 62 is to trap harmonic currents and, in another aspect, to reduce the amount of source or fundamental current drawn into itself; any means to that end are encompassed by the scope of the invention.

In yet another embodiment, the inductors 60, 62 may comprise multi-stranded wires twisted together, also referred to as Litz wire, to reduce the "skin effect". By way of background, in AC systems, the skin effect is the tendency for the electric current to flow at the outer portion of a conductor, thereby increasing the effective resistance of the conductor with the increase of frequency. Other types of conductors suitable for conducting electricity and being wound around a core are equally applicable for forming an inductor.

Figure 6:
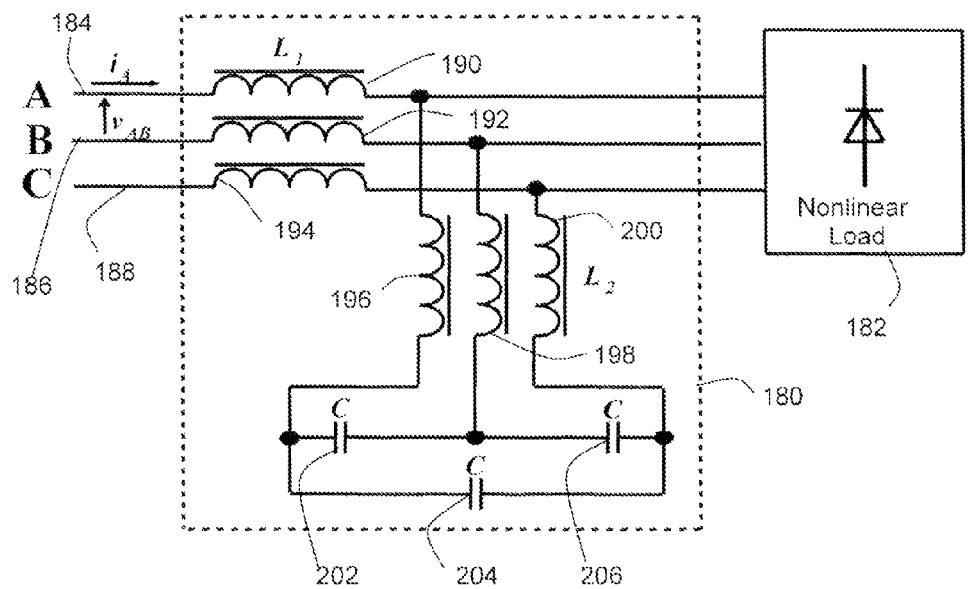
FIG. 6 is an electrical schematic of a harmonic filter device for three phases, according to one aspect of the invention.

Referring now to FIG. 6, an embodiment of the invention is shown of a harmonics filter 180 configured for a three-phase power system. It will be understood that the three-phase harmonic filter device 180 comprises three coaxial reactor assemblies and three capacitors, wherein the capacitors are electrically connected in various configurations as discussed below. Therefore, the three-phase harmonics filter device 180 comprises three coaxial reactor assemblies.

Figure 7:
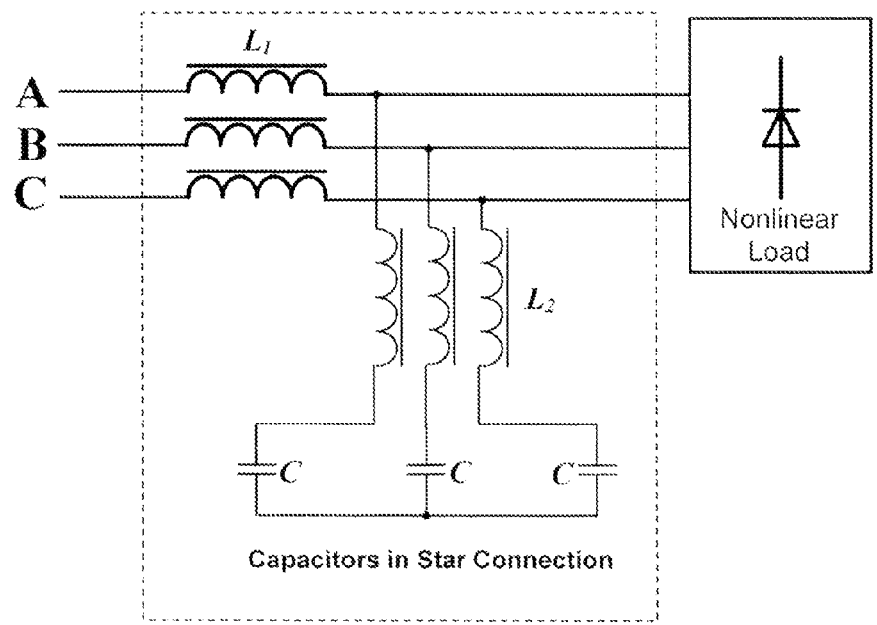
FIG. 7 is an electrical schematic of a harmonic filter device for three phases, according to another aspect of the invention.

The voltage $V_{ab}$ is the line voltage between input lines A 184 and B 186, and the current $i_A$ is the line current flowing through input line A 184. In this embodiment, the capacitors 202, 204, 206 for each phase are arranged in a "delta" connection, as known in the art. It is appreciated that other capacitor arrangements suitable for three-phases, for example the "wye" or "star" arrangement, are equally applicable. The delta arrangement may be preferable in applications where the source voltage is below 480V. For higher source voltages, the start arrangement may be preferable. An example of a star arrangement is shown in FIG. 7.

Returning to FIG. 6, the three-phase harmonic filter device 180 comprises three power source lines 184, 186, 188. Along each line 184, 186, 188 is an inductor 190, 192, 194, respectively, that is electrically connected in series between the source terminal and the non-linear load 182. Electrically connected in parallel to each series inductor 190, 192, 194 is a corresponding shunt inductor 196, 198, 200, respectively. As shown in FIG. 6, the capacitors are connected in a delta arrangement, that is: (a) capacitor 202 is electrically connected to the ends of the shunt inductors 196 and 198; (b) capacitor 206 is electrically connected to the ends of the shunt inductors 198 and 200; and (c) capacitor 204 is electrically connected to the ends of the shunt inductors 196 and 200.

Two examples, namely Example 1 and Example 2, of a circuit comprising a power source and a non-linear load will be discussed below without limitation to the scope of the invention.

Figure 8:
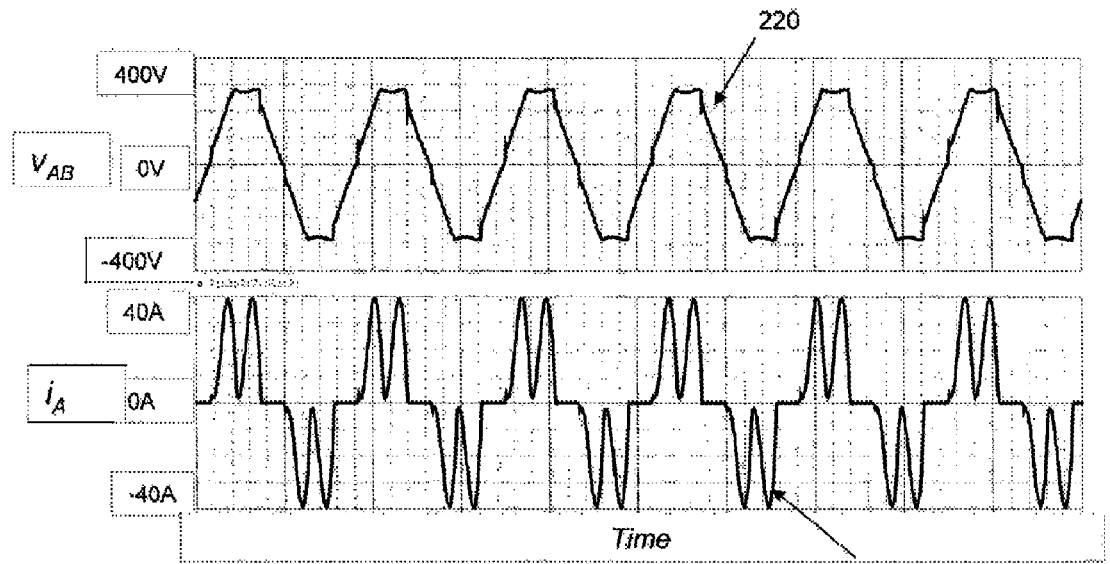
FIG. 8 is a voltage and current waveform from the data of Example 1.

In Example 1, a first circuit comprises a three-phase power source in direct electrical connection to a non-linear load. In this example, the harmonic filter of this invention is not connected to the circuit. The power source operates at a frequency of 60 Hz and has three connection lines A, B and C. Referring now to FIG. 8, the 60 Hz waveforms are shown of the input line voltage $V_{AB}$ measured across lines A and B, and the line current $i_A$ measured through line A. Specifically, the voltage waveform 220 shows the line voltage $V_{AB}$, from which a voltage Total Harmonic Distortion ($THD_V$) is measured to be 6.8%. Similarly, the current waveform 222 shows the line current $i_A$, from which a current Total Harmonic Distortion ($THD_i$) is measured to be 66.8%. It can be further seen from the current waveform 222 that each cycle has multiple peaks, as opposed to a desired sinusoidal waveform. Further, the current waveform 222 and voltage waveform 220 are not linearly related. The results shown in this example provide a baseline for comparison with the use of the harmonic filter device of the invention.

In Example 2, a second circuit comprises a three-phase power source, a three-phase harmonic filter device 180 and a non-linear load, wherein a specific embodiment of the harmonic filter device 180 is electrically connected in series there-between the power source and load. For the purpose of comparing the second circuit to the first circuit, it is understood that the power source and non-linear load in Example 2 are identical in form and operation to the power source and non-linear load in Example 1. The inclusion of the harmonic filter device 180, using the "delta" capacitor configuration shown in FIG. 6, reduces the THD. It is noted that the second circuit comprises a configuration according to FIG. 3a, wherein the start point of each series inductor is connected to the finish point of a corresponding shunt inductor.

Figure 9:
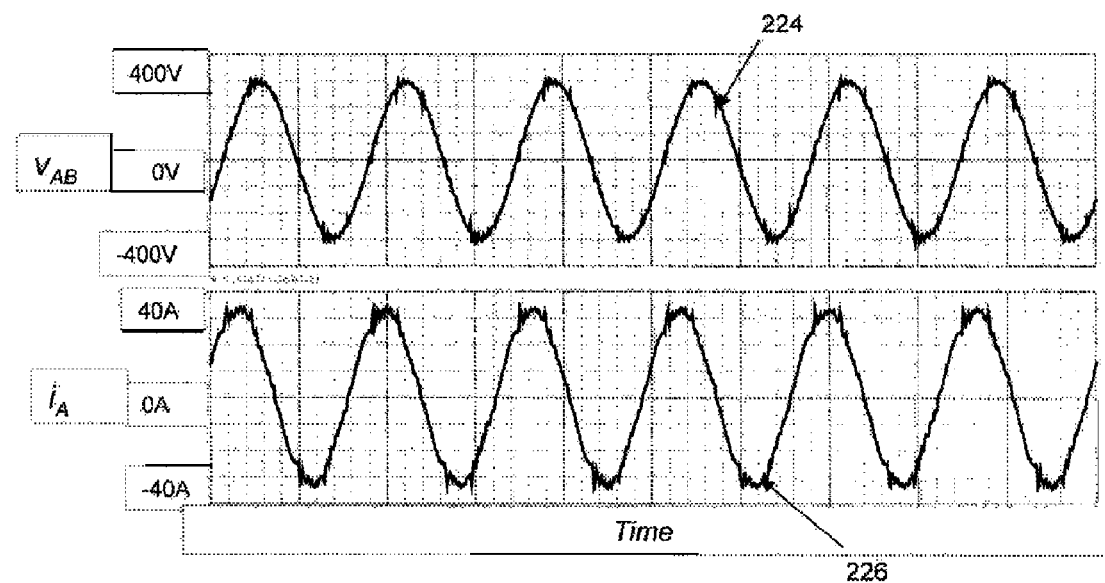
FIG. 9 is a voltage and current waveform from the data of Example 2.

Continuing with Example 2, the waveform 224 of the voltage $V_{AB}$ and the waveform 226 of the current $i_A$ is shown in FIG. 9. It can be seen that voltage waveform 224 and current waveform 226 have a sinusoidal form as a result of using the harmonic filter device 180 in the circuit. Specifically, in the embodiment according to Example 2, a $THD_V$ of 1.3% and a $THD_i$ of 4.8% are achieved. The dominant harmonics, namely the $5^{th}$, $7^{th}$, $11^{th}$ and $13^{th}$ harmonics, are practically attenuated.

Figure 10:
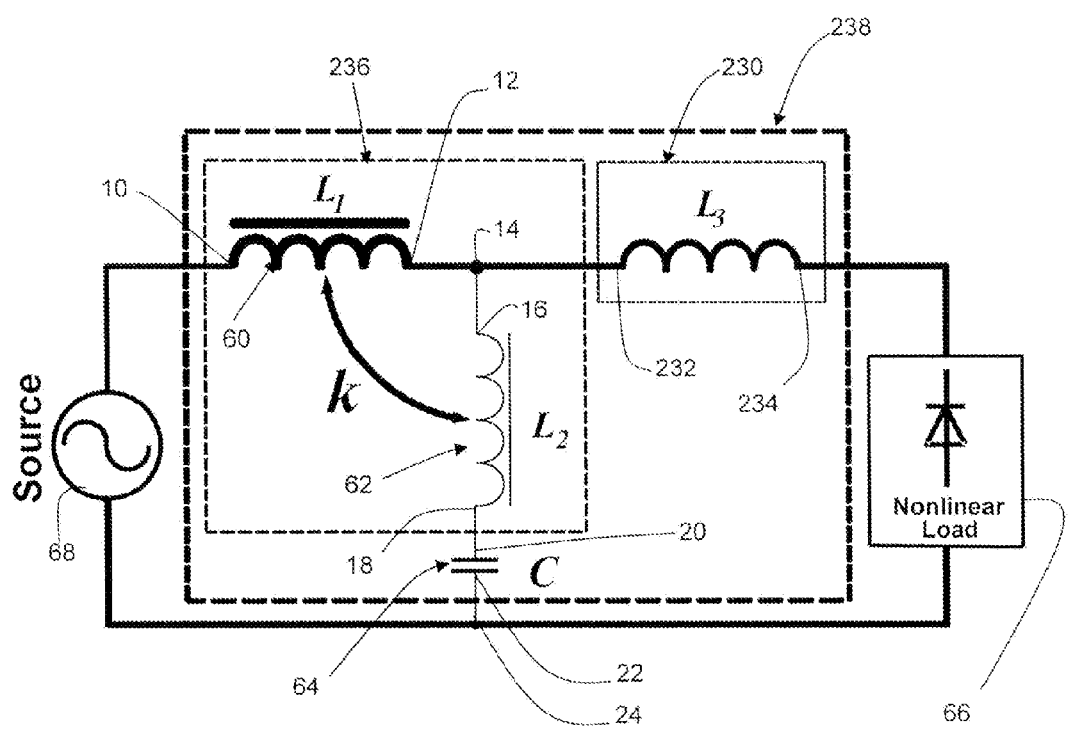
FIG. 10 is an electrical schematic of another embodiment of a harmonic filter device with three inductors for only one phase according to one aspect of the invention.

Turning to FIG. 10, in another aspect of the invention, a one phase harmonic filter 238 is provided comprising a first inductor 60 and a second inductor 62 that are magnetically coupled and wound around a core 72, and a third inductor 230 that is wound around another, i.e. separate core. The one phase harmonic filter 238 also comprises a capacitor 64. This is similar to the embodiment described in FIG. 1, however, it contains the addition of a third inductor 230.

In particular, the first inductor 60 comprises a first end 10 and a second end 12. The second inductor 62 also comprises a first end 16 and a second end 18. Either one of the first inductor 60 or the second inductor 62 is wound around the core 72 and the other of the first inductor 60 and the second inductor 62 is wound there-around. The inductors 60, 62 and the core 72 form a coaxial assembly 236.

Located on a separate core is the third inductor 230, which also comprises a first end 232 and a second end 234. The first inductor 60 is electrically connected in series between the power source 68 and the third inductor 230. The first end 10 of the first inductor 60 is electrically connected to the power source 68, and the second end 12 of the first inductor 60 is electrically connected to the first end 232 of the third inductor 230, at junction 14. The second end 234 of the third inductor 230 is electrically connected to the non-linear load 66. The second inductor 62 is electrically connected to the first inductor 60 end the third inductor 230 at junction 14. The first end 16 of the second inductor 62 is electrically connected to junction 14 and the second end 18 is electrically connected in series to a first end 20 of the capacitor 64. A second end 22 of the capacitor 64 is connected at another electrical junction 24 connecting the power source 68 and the non-linear load 66.

Although not shown, in another embodiment of the invention, it is appreciated that the first end 16 of the second inductor 62 is electrically connected to the first end 10 of the first inductor 60, instead of the second end 12 as shown in FIG. 10.

A person skilled in the art of electronics will appreciate that the above-described one phase harmonic filter 238 may be also applied to a three-phase harmonic filter, whereby each phase comprises three inductors.

The presence of the third inductor 230 provides several advantages including further suppressing the major harmonics (e.g. $5^{th}$, $7^{th}$, $11^{th}$ and $13^{th}$ harmonics) generated by non-linear loads such as, for example, variable speed drives. In particular, in an experiment of a three-phase harmonic filter, whereby each phase comprised three inductors as described in FIG. 10, a 60 Hz waveform was applied to the filter and a $THD_i$ of less than 4.5% and a $THD_V$ of less than 1.2% were achieved.

It is also recognized that the third inductor 230 improved the power factor. The third inductor 230 also increased the voltage consistency, such that the voltage generated by the power source 68 is approximately the same voltage outputted by the harmonics filter to the non-linear load 66. The presence of the third inductor 230 also allows for a capacitor 64 with a smaller or lower capacitance value.

Figures 11A, 11B:
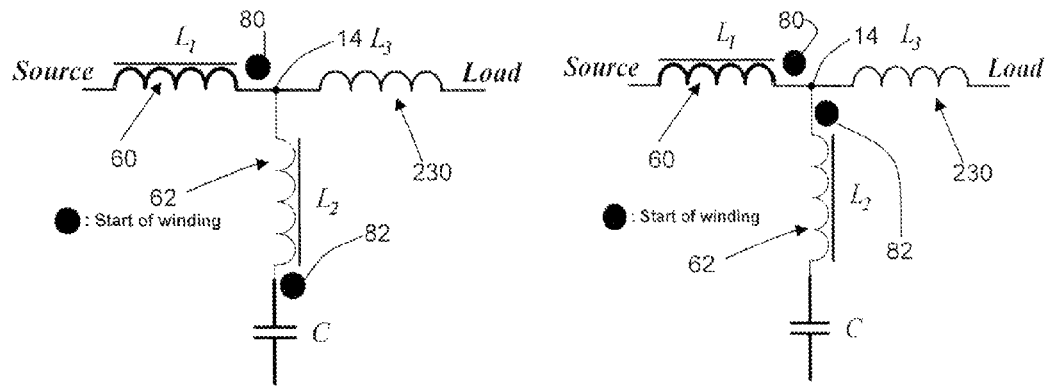
FIG. 11a is an electrical schematic of an embodiment of a harmonic filter device with three inductors showing only one phase.
FIG. 11b is an electrical schematic of another embodiment similar to FIG. 11a showing only one phase.

FIGS. 11 through 13 represent various topologies for only one phase, for example, of a three-phase or single-phase harmonic filter. FIG. 11a and 11b show a similar topology to that of FIG. 10. More particularly, in FIG. 11a, the start point 80 on the first inductor 60 is electrically connected to the finish point of the second inductor 62 at a junction 14, whereby the junction 14 is also electrically connected to one end of the third inductor 230. The other end of the third inductor 230 is electrically connected to the load. The finish point of the first inductor 60 is electrically connected to the source. The start point 82 of the second inductor 62 is electrically connected to a capacitor. In another embodiment shown in FIG. 11b, the start point 80 of the first inductor 60 is electrically connected at the junction 14 to the start point 82 of the second inductor 62. Other configurations for the start and finish points on the inductors are encompassed within the scope of this invention.

Figures 12A, 12B:
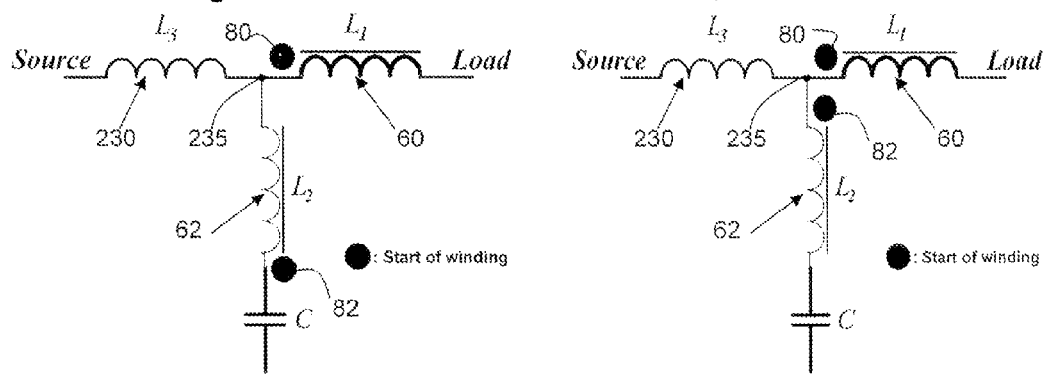
FIG. 12a is an electrical schematic of an embodiment of a harmonic filter device with three inductors showing only one phase.
FIG. 12b is an electrical schematic of another embodiment similar to FIG. 12a showing only one phase.

FIGS. 12a and 12b show a different topology wherein one end of the third inductor 230 is electrically connected to the source and the other end of the third inductor 230 is electrically connected at a junction 235. The first inductor 60 is electrically connected between the junction 235 and the load. In one particular embodiment shown in FIG. 12a, the start point 80 of the first inductor 60 is electrically connected at junction 235, which is also in electrical connection with the third inductor 230 and the finish point of the second inductor 62. The finish point of the first inductor 60 is electrically connected to the load, and the start point 82 of the second inductor 62 is electrically connected to a capacitor. By contrast, in FIG. 12b, the start point 82 of the second inductor 62 is electrically connected to the third inductor 230 at junction 235, whereby the finish point of the second inductor 62 is electrically connected to the capacitor. Other configurations for the start and finish points on the inductors are encompassed within the scope of this invention.

Figures 13A, 13B:
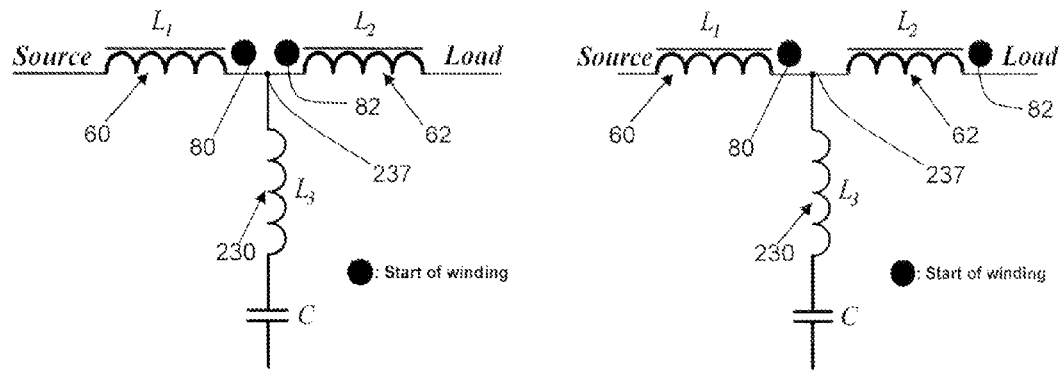
FIG. 13a is an electrical schematic of an embodiment of a harmonic filter device with three inductors showing only one phase.
FIG. 13b is an electrical schematic of another embodiment similar to FIG. 13a showing only one phase.

FIGS. 13a and 13b show a different topology wherein the power source, the first inductor 60, the second inductor 62 and the load are electrically connected in series with one another. One end of the first inductor 60 is electrically connected to the source and another end is electrically connected to a junction 237. One end of the second inductor 62 is electrically connected to the junction 237 and the other end is electrically connected to the load. The third inductor 230 is electrically connected in parallel to the first and second inductors 60, 62. One end of the third inductor 230 is electrically connected to the junction 237 and the other end is electrically connected to a capacitor. In one particular embodiment shown in FIG. 13a, the start point 80 of the first inductor 60 is electrically connected at junction 237, which is also in electrical connection with the third inductor 230 and the start point 82 of the second inductor 62. The finish point of the first inductor 60 is electrically connected to the power source, and the finish point 82 of the second inductor 62 is electrically connected to the load. By contrast, in FIG. 13b, the start point 82 of the second inductor 62 is electrically connected to the load and the finish point of the second inductor 62 is electrically connected to the junction 237. Other configurations for the start and finish points on the inductors are encompassed within the scope of this invention.

In the embodiments shown in FIGS. 11 through 13, there are at least two layers of inductors in a layered coaxial arrangement around the core 72. The arrangement has an inner and outer layer which comprises various combinations, including any one of the following: the first 60 and the second 62 inductors, respectively; the second 62 and the first 60 inductors, respectively; the second 62 and the third 230 inductors, respectively; the third 230 and the second 62 inductors, respectively; the first 60 and the third 230 inductors, respectively; or, the third 230 and the first 60 inductors, respectively.

It is appreciated that various topologies for the three inductors are encompassed by the scope of this invention and may be applied to three-phase power systems. It is further appreciated that all of the above inductor pairs comprising the first inductor 60 and second inductor 62, whether in series or parallel to one another, are used to form a coaxial reactor assembly.

Figure 14:
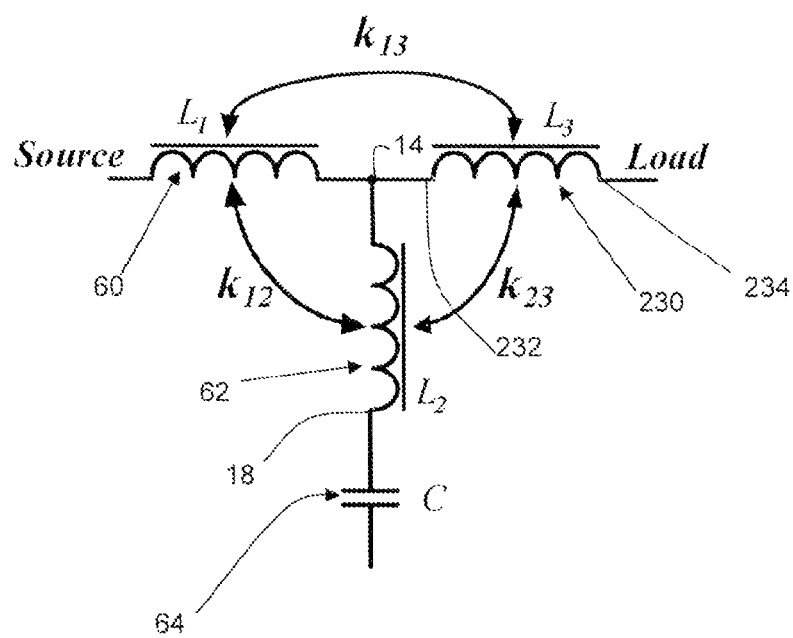
FIG. 14 is an electrical schematic of another embodiment of a harmonic filter device with three inductors coaxially wound around a single core showing only one phase.

FIG. 14 shows another embodiment of the invention of only one phase, for example, of a three-phase or single-phase harmonic filter comprising a first inductor 60, a second inductor 62 and a third inductor 230 wound coaxially around a common core 72. Winding all three inductors 60, 62, 230 coaxially around the same core 72 magnetically couples the three inductors. Thus, three layers of inductors are coaxially formed around the core 72. In particular, a coupling factor $k_{12}$ is generated between the first inductor 60 and second inductor 62. Another coupling factor $k_{23}$ is generated between the second inductor 62 and the third inductor 230. Another coupling factor $k_{13}$ is generated between the third inductor 230 and the first inductor 60. The coupling factors are generated because the inductors 60, 62, 230 share a common core 72, and are increased because they are wound coaxially around the core 72.

As discussed above, magnetically coupling the inductors on a common core 72 provides several advantages. These include increasing the power efficiency, reducing the capacitance value, reducing the number of cores and reducing the overall size of the harmonic filter.

Figure 15A:
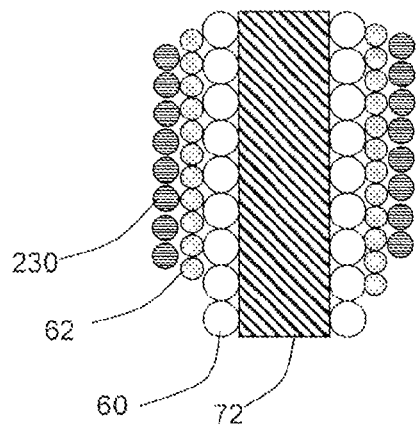
FIG. 15a is a cross-sectional view of a coaxial reactor assembly with three inductors according to one aspect of the invention.
Figure 15B:
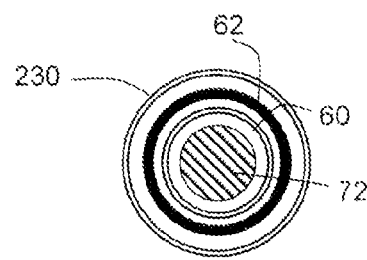

FIGS. 15a and 15b show a single reactor assembly comprising a single reactor core 72 and three coaxially wound inductors 60, 62, 230. The inductors form a layered coaxial arrangement around the core 72. Thus, another outer layer is formed comprising, for example, the third inductor 230. Each of the inductors 60, 62, 230 are coated with an insulation to electrically insulate the inductors 60, 62, 230 from one another and to electrically insulate the wires within each inductor 60, 62, 230. In one embodiment, the first inductor 60 is wound around the reactor core 72 first. The second inductor 62 is then wound around the outer perimeter of the first inductor 60, such that the first inductor 60 and the second inductor 62 are coaxial with one another. Then the third inductor 230 is wound around the outer perimeter of the second inductor 62, such that all three inductors 60, 62, 230 are coaxial with one another. In another embodiment, not shown, the second inductor 62 may be wound first around the core 72, the third inductor 230 may be wound around the outer perimeter of the second inductor 62, and the first inductor 60 may be wound around the outer perimeter of the third inductor 230. It is appreciated that there are different configurations for winding the three inductors 60, 62, 230 coaxially around the core 72 and any such configuration to that end is encompassed by the scope of the invention. The cross-sectional area and/or materials of the wire or wires in each of the inductors 60, 62, 230 may also be different. It is also appreciated that having layered inductors or coaxial inductors along the length of the reactor core 72, may be also referred to as a coaxial reactor assembly.

Figure 16:
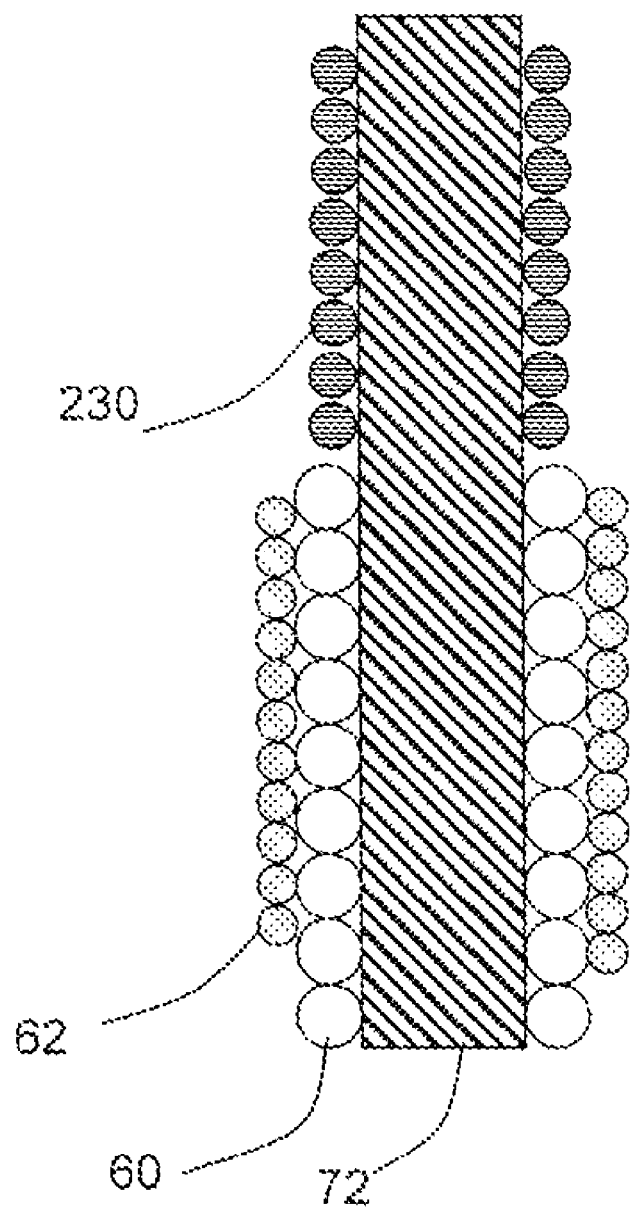
FIG. 16 is a cross-sectional view of another embodiment of a coaxial reactor assembly with three inductors according to one aspect of the invention.

Referring now to FIG. 16, another embodiment of a layered coaxial arrangement around a core 72 is provided. Two of the three inductors are provided in a layered arrangement and the remaining inductor is wound around the same core in a non-layered arrangement. In other words, the inner and outer layers cover a first section of the core and the remaining one of the three inductors is wound over a second section of the core and separated from the inner and outer layers. The inner layer is formed from one inductor adjacent to the core 72. An outer layer is provided over the inner layer, whereby the another layer is formed from another of the inductors. The remaining inductor is wound around the same core 72, either above or below the layered arrangement of the other two inductors. In the embodiment shown in FIG. 16, the inner layer comprises the first inductor 60 and the outer layer comprises the second inductor 62. The third inductor is located adjacent to the layered arrangement, also wound around the same core 72.

By having two of the inductors in a layered arrangement and another inductor in a non-layered arrangement, but still wound on the same core 72, all three inductors are magnetically coupled. The inductor that is not in a layered arrangement will have a lower coupling factor to the other inductors, compared with the inductors that are in a layered arrangement. For example, in the embodiment described in regards to FIG. 16, the coupling factor $k_{13}$ will be lower than the coupling factor $k_{12}$, since the first and second inductors 60, 62 are in a layered arrangement and the third inductor 230 is not in a layered arrangement. It is appreciated that the coupling factors can thus be adjusted depending on the position of an inductor relative to another inductor. Various arrangements combining layered and non-layered inductors that are magnetically coupled by a common core and have two or more inductors in a layered arrangement are encompassed by the scope of the invention.

Figure 17:
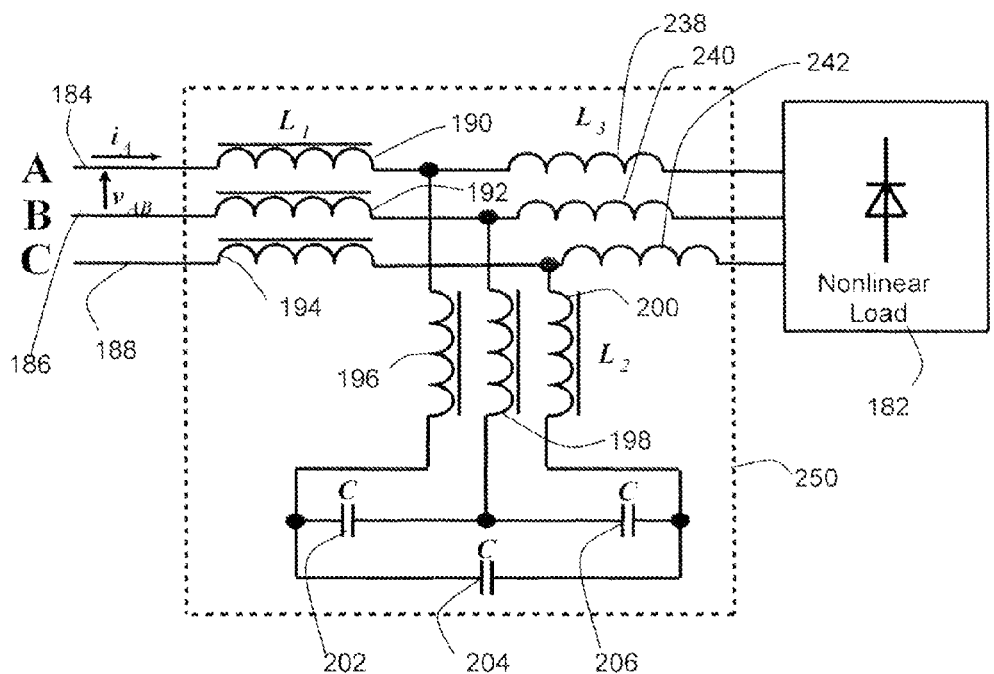
FIG. 17 is an electrical schematic of a harmonic filter device for three phases, according to one aspect of the invention.

FIG. 17 shows an embodiment of the invention of a three-phase harmonic filter 250, whereby each phase comprises three inductors. The embodiment shown herein is similar to the embodiment described with respect to FIG. 7, with the difference of each phase having a third inductor. In particular, for a first phase, a first inductor 190 and a third inductor 238 are electrically connected in series between the power source line 184 and the non-linear load 182: For a second phase, a first inductor 192 and a third inductor 240 are electrically connected in series between the power source line 186 and the non-linear load 182. For a third phase, a first inductor 194 and a third inductor 242 are electrically connected in series between the power source line 186 and the non-linear load 182. Each of the second inductors 196, 198 and 200 are electrically connected to each of the first inductors 190, 192 and 194, respectively. The capacitors 202, 204, 206 are connected in a delta configuration. Other configurations, such as the wye or the star configuration are equally applicable. It can also be seen by the straight bars along the first and second inductors, that in the first phase, the first inductor 190 and the second inductor 196 share a first single core; in the second phase, the first inductor 192 and the second inductor 198 share a second single core; and, in the third phase, the first inductor 194 and the second inductor 200 share a third single core. The third inductors 238, 240, 242 in each phase have a separate core.

Figure 18:
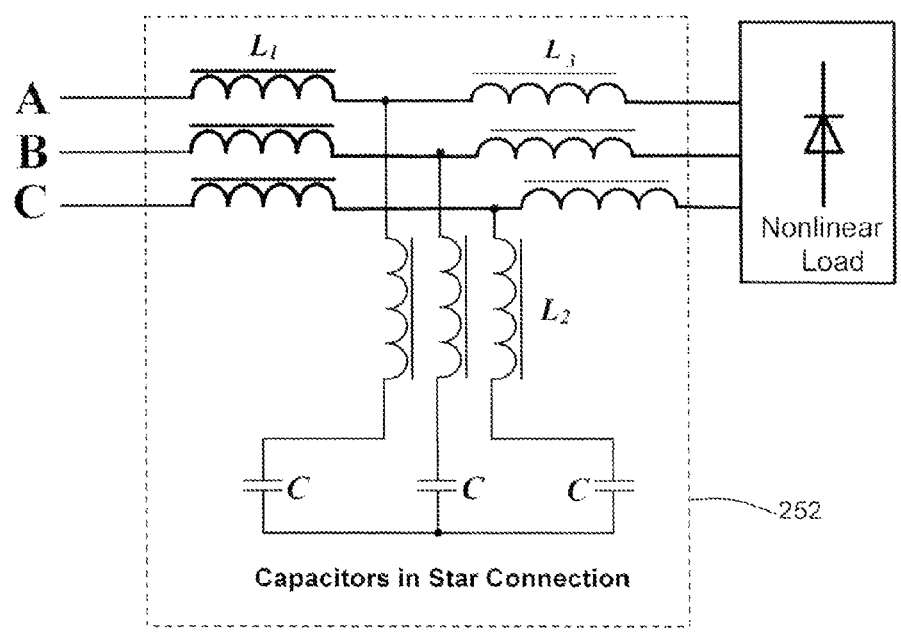
FIG. 18 is an electrical schematic of a harmonic filter device for three phases, according to another aspect of the invention.

However, it is readily understood that all three inductors in each phase may also share a single core. Referring now to FIG. 18, another embodiment of a three-phase harmonic filter 252 is provided. Although similar to the embodiment described with respect to FIG. 16, the embodiment in FIG. 17 comprises, for the first phase, three inductors share the first core. For the second phase, all three inductors share the second core. For the third phase, all three inductors share the third core. The capacitors are also shown in a star configuration. It is appreciated that the three inductors in each phase may all be in a layered coaxial arrangement. Alternatively, two of the inductors are in a layered coaxial arrangement, while the remaining inductor is in a non-layered arrangement.

Although the invention has been described with reference to certain specific embodiments, various modifications thereof will be apparent to those skilled in the art without departing from the purpose and scope of the invention as outlined in the claims appended hereto. Any examples provided herein are included solely for the purpose of illustrating the invention and are not intended to limit the invention in any way. Any drawings provided herein are solely for the purpose of illustrating various aspects of the invention and are not intended to be drawn to scale or to limit the invention in any way. The disclosures of all prior art recited herein are incorporated herein by reference in their entirety.

We claim:

1. A device for dampening harmonics, the device being electrically connectable to at least one power source and at least one non-linear load, the device comprising:

a first inductor comprising a first end being connectable to said at least one power source and a second end being electrically connectable to said at least one non-linear load;

a second inductor comprising a first end electrically connected to said first or said second end of said first inductor and a second end electrically connected to at least one capacitor; and, wherein said first and second inductors are in a coaxial arrangement comprising two layers wound around a core, said layers comprising:
an inner layer adjacent to said core, said inner layer comprising one of said inductors, and
an outer layer provided over said inner layer, said outer layer comprising the other of said inductors.

2. The device of claim 1, wherein said first end of said first inductor is a start of winding and said second end of said second inductor is another start of winding.

3. The device of claim 1, wherein said first end of said first inductor is a start of winding and said first end of said second inductor is another start of winding.

4. The device of claim 1, wherein said inner layer comprises said first inductor and said outer layer comprises said second inductor.

5. The device of claim 1, wherein said inner layer comprises said second inductor and said outer layer comprises said first inductor.

6. The device of claim 1, wherein said second inductor comprises a wire with a smaller cross-sectional area than said first inductor.

7. The device of claim 1, wherein said first end of said second inductor is connected to said second end of said first inductor.

8. A three-phase power distribution system comprising three phase assemblies, wherein each phase assembly comprises the device according to claim 1.

9. A device for dampening harmonics, the device being electrically connectable to at least one power source and at least one non-linear load, the device comprising:
a first inductor and a second inductor, each comprising a first end and a second end, wherein:
said first end of said first inductor being electrically connectable to said at least one power source;
said second end of said first inductor is electrically connected to said first end of said second inductor;
said second end of said second inductor being electrically connectable to said at least one non-linear load;
and said second end of said first inductor and said first end of said second inductor both electrically connected to at least one capacitor; and,
wherein said first and second inductors are in a coaxial arrangement comprising two layers wound around a core, said layers comprising:
an inner layer adjacent to said core, said inner layer comprising one of said inductors, and
an outer layer provided over said inner layer, said outer layer comprising the other of said inductors.

10. The device of claim 9, wherein said second end of said first inductor is a start of winding and said first end of said second inductor is a start of winding.

11. The device of claim 9, wherein said inner layer comprises said first inductor and said outer layer comprises said second inductor.

12. The device of claim 9, wherein said inner layer comprises said second inductor and said outer layer comprises said first inductor.

13. The device of claim 9, wherein said second inductor comprises a wire with a smaller cross-sectional area than said first inductor.

14. A three-phase power distribution system comprising three phase assemblies, wherein each phase assembly comprises the device according to claim 9.

15. A device for dampening harmonics, the device being electrically connectable to at least one power source and at least one non-linear load, the device comprising:
a first inductor, a second inductor and a third inductor, each comprising a first end and a second end;
said first end of said first inductor being electrically connectable to said at least one power source and said second end of said first inductor electrically connected to said first end of said third inductor;
said second end of said third inductor being electrically connectable to said at least one non-linear load;
said first end of said second inductor electrically connected to said first or said second end of said first inductor;
said second end of said second inductor electrically connected to at least one capacitor; and,
wherein two of said inductors are in a coaxial arrangement comprising two layers wound around a first core, said layers comprising:
an inner layer adjacent to said core, said inner layer comprising one of said inductors, and
an outer layer provided over said inner layer, said outer layer comprising the other of said inductors.

16. The device of claim 15, wherein the remaining one of said three inductors is coaxially provided as a third layer over said outer layer.

17. The device of claim 15, wherein the inner and outer layers cover a first section of the first core and wherein the remaining one of said three inductors is wound over a second section of the first core and separated from the inner and outer layers.

18. The device of claim 15, wherein the remaining one of said three inductors is wound around a second core.

19. The device of claim 18, wherein said first and second inductors are wound around the first core, and said first end of said first inductor is a start of winding and said second end of said second inductor is another start of winding.

20. The device of claim 18, wherein said first and second inductors are wound around the first core, and said first end of said first inductor is a start of winding and said first end of said second inductor is another start of winding.

21. The device of claim 18, wherein said inner layer comprises said first inductor and said outer layer comprises said second inductor.

22. The device of claim 18, wherein said inner layer comprises said second inductor and said outer layer comprises said first inductor.

23. The device of claim 15, wherein said first end of said second inductor is connected to said second end of said first inductor.

24. A three-phase power distribution system comprising three phase assemblies, wherein each phase assembly comprises the device according to claim 15.

* * * * *